US012713583B2

(12) United States Patent
Fujimoto et al.

(10) Patent No.: US 12,713,583 B2
(45) Date of Patent: Aug. 18, 2026

(54) SEMICONDUCTOR DEVICE HAVING WORD LINES EMBEDDED IN GATE TRENCHES FORMED IN STI REGIONS AND ACTIVE REGIONS OF A SEMICONDUCTOR SUBSTRATE

(71) Applicant: MICRON TECHNOLOGY, INC., Boise, ID (US)

(72) Inventors: Toshiyasu Fujimoto, Higashihiroshima (JP); Yoshihiro Matsumoto, Kobe (JP)

(73) Assignee: Micron Technology, Inc., Boise, ID (US)

( * ) Notice: Subject to any disclaimer, the term of this patent is extended or adjusted under 35 U.S.C. 154(b) by 782 days.

(21) Appl. No.: 18/051,690

(22) Filed: Nov. 1, 2022

(65) Prior Publication Data

US 2024/0147699 A1 May 2, 2024

(51) Int. Cl.
*H10B 12/00* (2023.01)

(52) U.S. Cl.
CPC ........... *H10B 12/34* (2023.02); *H10B 12/053* (2023.02); *H10B 12/315* (2023.02); *H10B 12/488* (2023.02)

(58) Field of Classification Search
CPC .... H10B 12/053; H10B 12/34; H10B 12/315; H10B 12/488
See application file for complete search history.

(56) References Cited

U.S. PATENT DOCUMENTS

| | | | | |
|---|---|---|---|---|
| 12,156,398 | B2 | 11/2024 | Fujimoto et al. | |
| 2010/0044787 | A1 | 2/2010 | Sugioka | |
| 2013/0062679 | A1 | 3/2013 | Manabe | |
| 2020/0105765 | A1 | 4/2020 | Kim et al. | |
| 2021/0398588 | A1 | 12/2021 | Wang et al. | |
| 2022/0165886 | A1 | 5/2022 | Long | |
| 2022/0415899 | A1* | 12/2022 | Liu ...................... | H10B 12/053 |
| 2023/0120621 | A1 | 4/2023 | Yang et al. | |
| 2023/0189502 | A1 | 6/2023 | Fujimoto et al. | |
| 2024/0021690 | A1* | 1/2024 | Tsai ..................... | H10D 30/611 |

FOREIGN PATENT DOCUMENTS

| | | |
|---|---|---|
| ES | 1078649 U | 2/2013 |

* cited by examiner

*Primary Examiner* — Nelson Garces
(74) *Attorney, Agent, or Firm* — Dorsey & Whitney LLP

(57) ABSTRACT

An apparatus that includes a semiconductor substrate having first and second gate trenches arranged in parallel and extending in a first direction, and first and second gate electrodes embedded in the first and second gate trenches, respectively, via a gate insulating film. Each of the first and second gate electrodes includes a first conductive film located at a bottom of the respective first and second gate trenches and a second conductive film stacked on the first conductive film. The second conductive film included in a first portion of the second gate electrode is thinner than the second conductive film included in a first portion of the first gate electrode which is arranged adjacently to the first portion of the second gate electrode in a second direction crossing to the first direction. The second conductive film is lower in work function than the first conductive film.

11 Claims, 11 Drawing Sheets

24a
24a
24a
C
10

B
B
C
24
M
Y
A
X
24a
24a
24
22a 14
2
21
10
24a
13
13
13
13
24a
24
22a
4
14

10
21
2

24a
24a
24a
C
C
10
B
B
24
Y
A
X 24a
24a
24
22a
14
2
21
10

24a
24a
13
13
13
13
24
22a
4
14
10
21
2

SEMICONDUCTOR DEVICE HAVING WORD LINES EMBEDDED IN GATE TRENCHES FORMED IN STI REGIONS AND ACTIVE REGIONS OF A SEMICONDUCTOR SUBSTRATE

BACKGROUND

Some cell transistors used in a semiconductor memory device such as a DRAM have a configuration in which a gate electrode formed by a metal/polycrystalline silicon stack is embedded in a gate trench in order to reduce GIDL. Further reduction of GIDL has been demanded in recent years.

DETAILED DESCRIPTION

Various embodiments of the present disclosure will be explained below in detail with reference to the accompanying drawings. The following detailed description refers to the accompanying drawings that show, by way of illustration, specific aspects, and various embodiments of the present disclosure. The detailed description provides sufficient detail to enable those skilled in the art to practice these embodiments of the present disclosure. Other embodiments may be utilized, and structural, logical, and electrical changes may be made without departing from the scope of the present disclosure. The various embodiments disclosed herein are not necessary mutually exclusive, as some disclosed embodiments can be combined with one or more other disclosed embodiments to form new embodiments.

Figure 1:
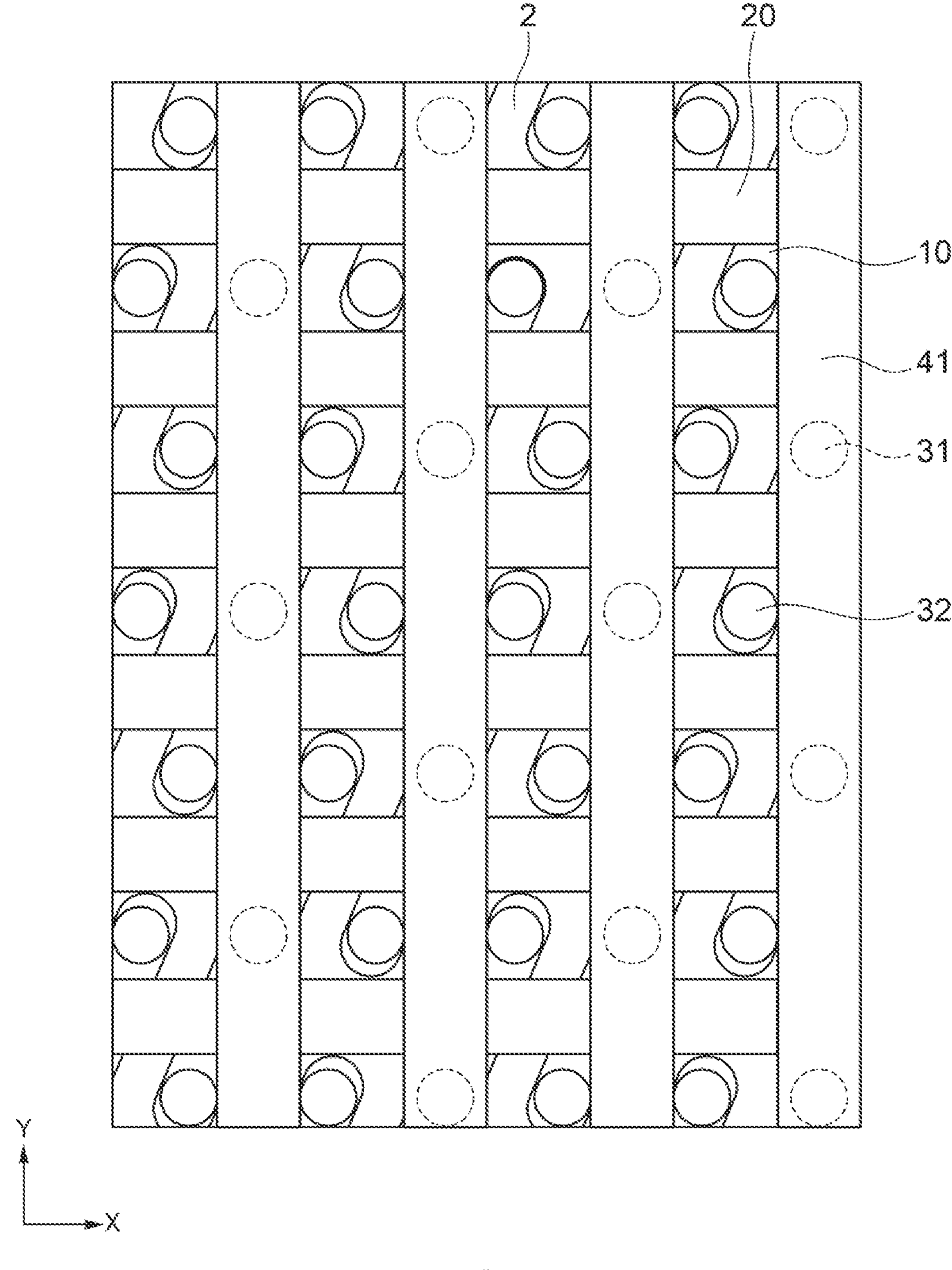
FIG. 1 is a schematic plan view showing a portion of a semiconductor memory device according to the present disclosure.
Figure 2:
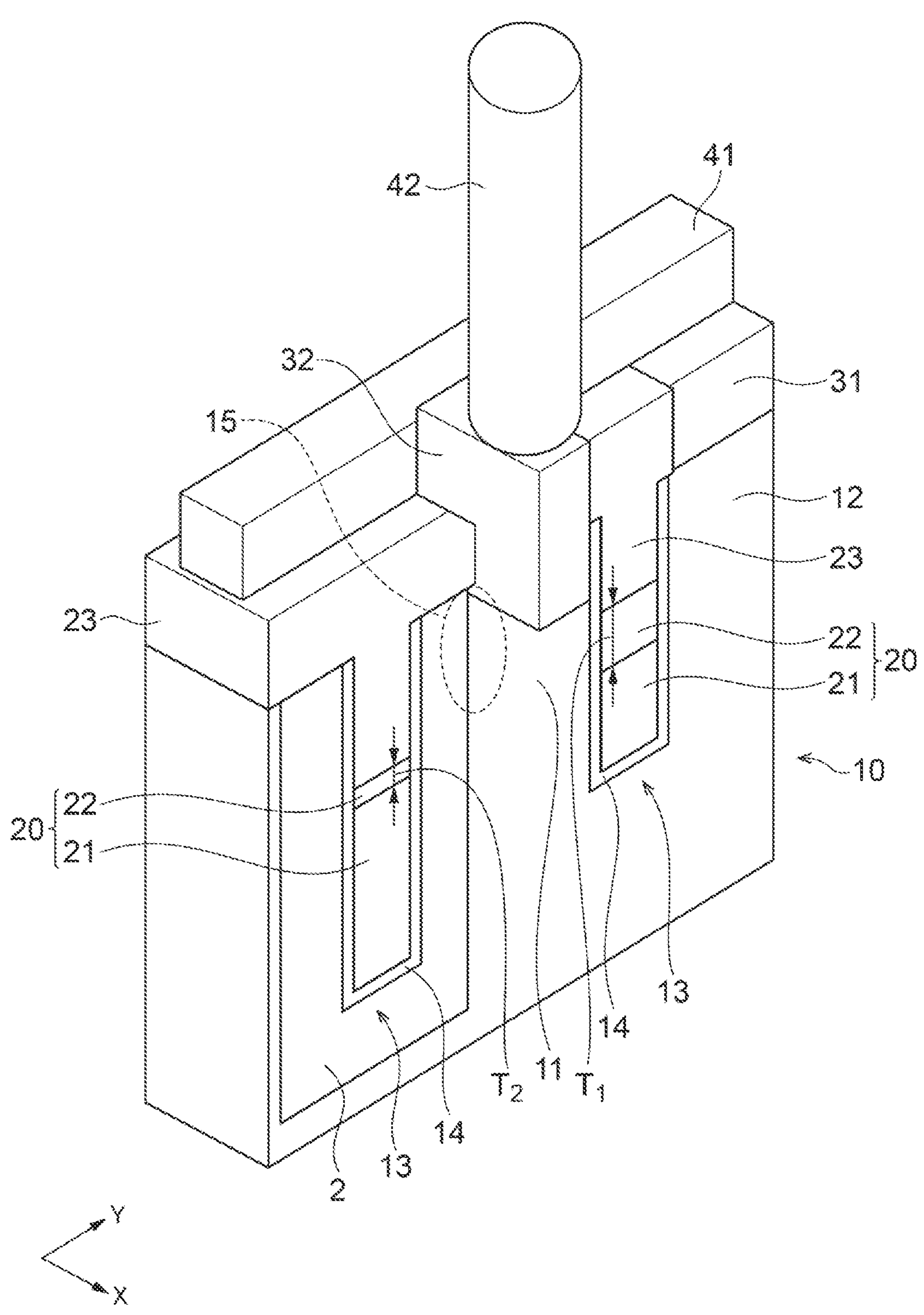
FIG. 2 is a schematic perspective view showing a portion of the semiconductor memory device according to the present disclosure.

FIGS. 1 and 2 are a schematic plan view and a schematic perspective view showing a portion of a semiconductor memory device according to the present disclosure, respectively. The semiconductor memory device according to the present disclosure is a DRAM and includes a plurality of active regions 10 partitioned by an STI region 2, a plurality of word lines 20 that cross the active regions 10 in the X direction, and a plurality of bit lines 41 that cross the active regions 10 in the Y direction. In some examples, the X direction and the Y direction may be perpendicular to one another. The active region 10 is a portion of a semiconductor substrate. Two of the word lines 20 cross each of the active regions 10 in the X direction. In this manner, each active region 10 is divided into three source/drain regions. A center source/drain region 12 is connected to a corresponding one of the bit lines 41 through a bit contact 31. Two of the source/drain regions 11 located on both sides are connected to corresponding cell capacitors 42 through cell contacts 32, respectively.

As shown in FIG. 2, gate trenches 13 extending in the X direction are formed in the STI region 2 and the active region 10. Source/drain regions 11 and 12 are provided on both sides in the Y direction of each gate trench 13 formed in the active region 10. The inner wall of each gate trench 13 is covered with a gate insulting film 14 made of, for example, silicon oxide. The word line 20 serving as a gate electrode is embedded in each gate trench 13 via the gate insulating film 14. The word line 20 is formed by a metal film 21 as a first conductive film located at the bottom of the gate trench 13 and a polycrystalline silicon film 22 as a second conductive film stacked on the metal film 21. A gate cap insulating film 23 made of, for example, silicon nitride is provided above the polycrystalline silicon film 22. The metal film 21 is made of, for example, titanium nitride or tungsten. A boron-doped polycrystalline silicon film may be used in place of the metal film 21. The polycrystalline silicon film 22 is doped with phosphorous, and therefore the conductive type thereof is an N-type. With this configuration, a channel is formed around the gate trench 13 when a predetermined ON potential is applied to the word line 20, so that the source/drain regions 11 and 12 are electrically connected to each other.

The work function of the material of the polycrystalline silicon film 22 is about 4.1, and thus the polycrystalline silicon film 22 relaxes an electric field applied to an upper region of the channel to reduce GIDL. Consequently, an off-leakage current is reduced, resulting in improvement of refresh characteristics. Further, the metal film 21 makes the resistance of the word line 20 low. The work function of the material of the metal film 21 is about 4.5 to about 4.7. Therefore, the metal film 21 prevents excessive drop of a threshold voltage of a cell transistor to reduce the off-leakage current. In a case of using a boron-doped polycrystalline silicon film in place of the metal film 21, the work function thereof is about 5.2. As described above, the metal film 21 with a lower resistance value is located at the bottom of the gate trench 13, and the polycrystalline silicon film 22 having a lower work function is located on the metal film 21 in the present embodiment. Therefore, it is possible to make the resistance of the word line 20 low and reduce an off-leakage current of a cell transistor.

Furthermore, the thickness of the polycrystalline silicon film 22 in the gate trench 13 formed in the active region 10 is T1, whereas the thickness of the polycrystalline silicon film 22 in the gate trench 13 formed in the STI region 2 is T2 (<T1), as shown in FIG. 2. Since the depth position of the interface between the metal film 21 and the polycrystalline silicon film 22 is the same between the gate trench 13 formed in the active region 10 and the gate trench 13 formed in the STI region 2, the depth position of the interface between the polycrystalline silicon film 22 and the gate cap insulating film 23 is deeper in the gate trench 13 formed in the STI region 2 than in the gate trench 13 formed in the active region 10. With this configuration, the influence of the word line 20 embedded in the STI region 2 is reduced in the source/drain region 11 connected to the cell capacitor 42. That is, an electric field in a region 15 of the source/drain region 11 which is near the interface with the STI region 2 is relaxed, so that GIDL is further reduced. In addition, since a portion of the word line 20 which is embedded in the STI region 2 does not contribute to a switching operation, reduction in the thickness of the polycrystalline silicon film 22 in this portion does not affect the switching characteristics.

Figure 3A:
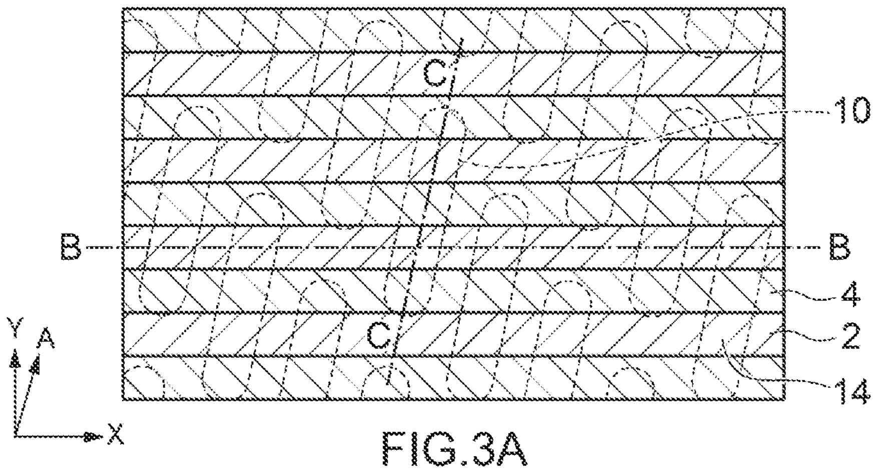
FIGS. 3A, 4A, 5A, 6A, 7A, 8A, 9A, and 10A are schematic plan views for explaining a manufacturing process of the semiconductor memory device according to the present disclosure.
Figure 3B:
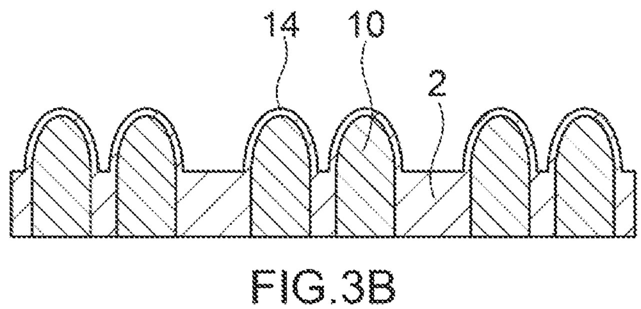
FIGS. 3B, 4B, 5B, 6B, 7B, 8B, 9B, and 10B are schematic sectional views along a line B-B respectively shown in FIGS. 3A, 4A, 5A, 6A, 7A, 8A, 9A, and 10A.
Figure 3C:
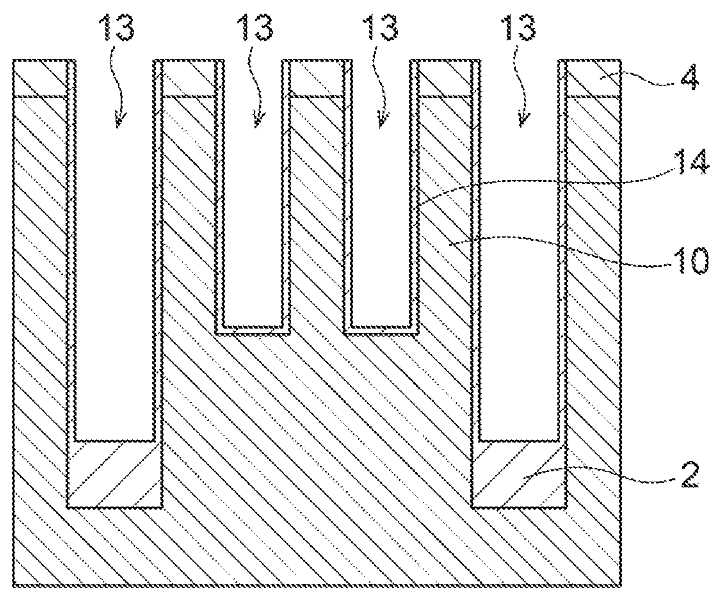
FIGS. 3C, 4C, 5C, 6C, 7C, 8C, 9C, and 10C are schematic sectional views along a line C-C respectively shown in FIGS. 3A, 4A, 5A, 6A, 7A, 8A, 9A, and 10A.
Figure 4A:
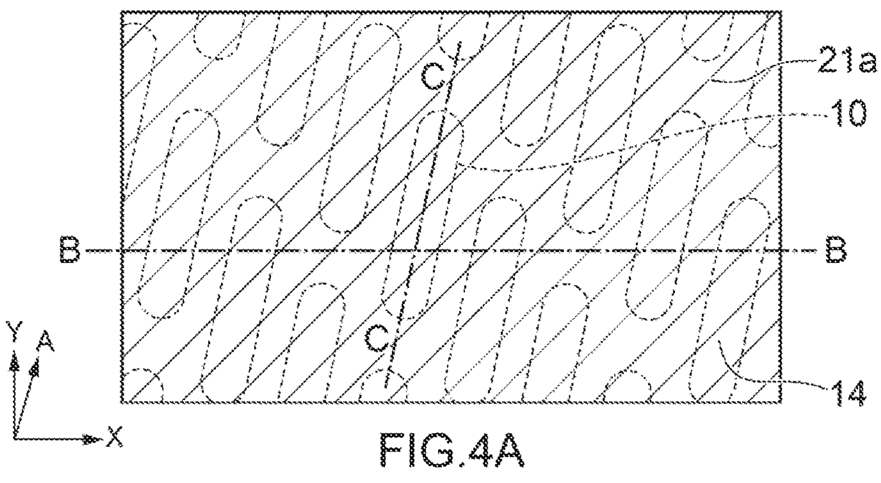
Figure 4B:
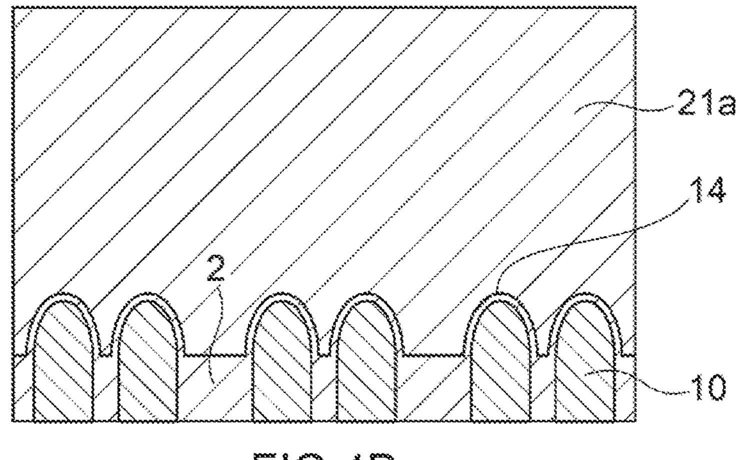
Figure 4C:
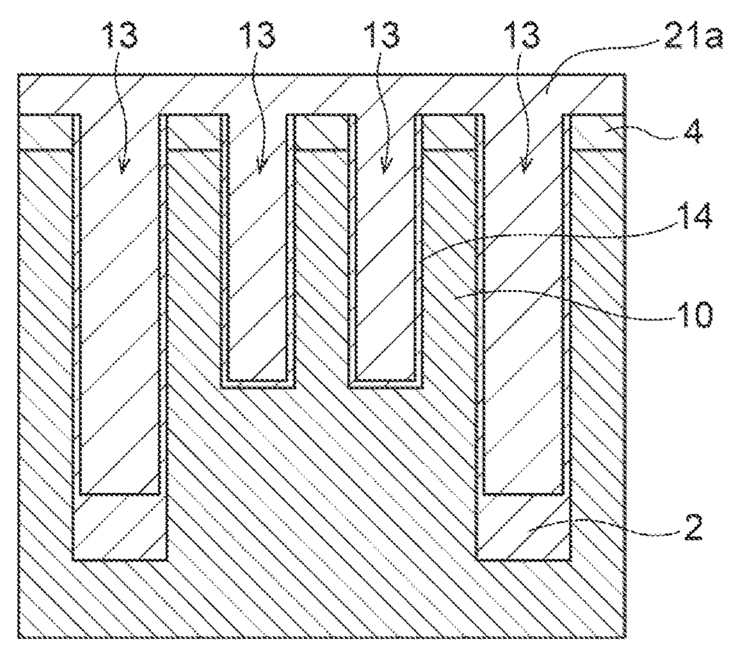
Figure 5A:
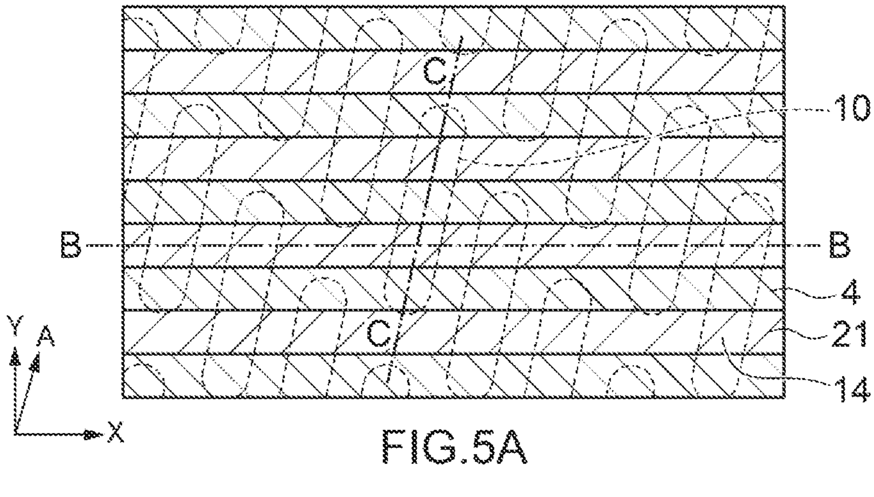
Figure 5B:
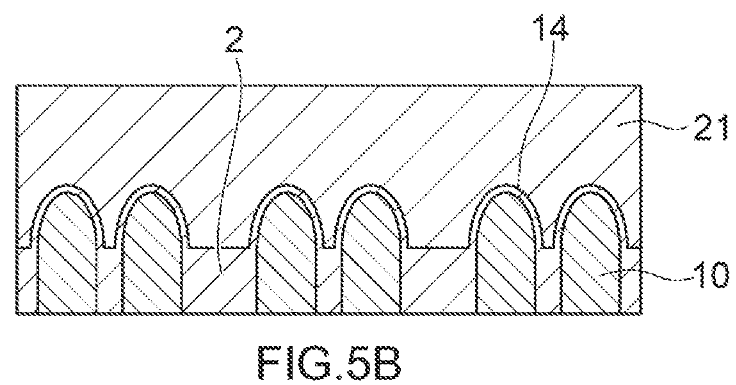
Figure 5C:
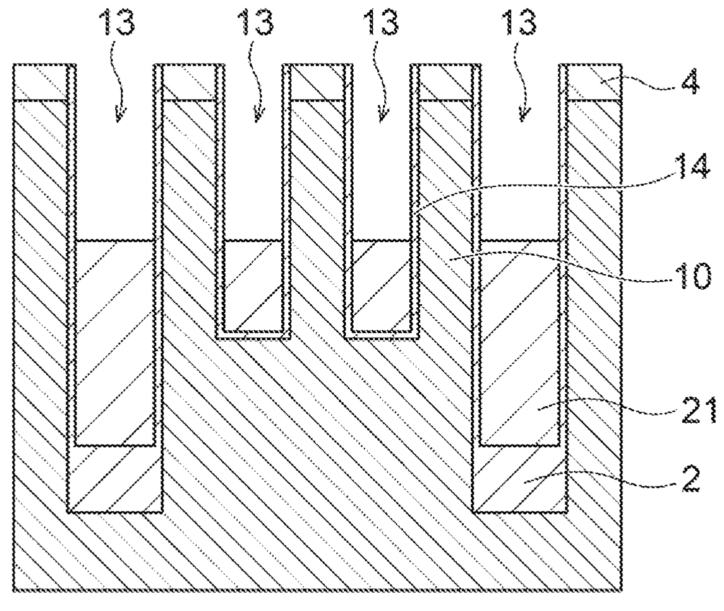

Next, a manufacturing process of the semiconductor memory device according to the present disclosure is described. First, as shown in FIGS. 3A to 3C, the active regions 10 are formed by etching a semiconductor substrate using hard mask 4 made of, for example, silicon oxide, and then regions between the active regions 10 are embedded with a material of the STI region 2, such as silicon oxide. The active regions 10 are each formed with its longitudinal direction aligned with the A direction. The A direction is inclined with respect to the Y direction that is the extending direction of the bit line 41 at a predetermined angle. Subsequently, the gate trenches 13 extending in the X direction are formed. Two of the gate trenches 13 are assigned to each active region 10. The depth of the gate trench 13 is deeper in the STI region 2 than in the active region 10. Next, the gate insulating film 14 made of silicon oxide is formed on the inner wall of each gate trench 13 by thermal oxidation. Subsequently, as shown in FIGS. 4A to 4C, a metal film 21*a* made of, for example, titanium nitride is deposited on the entire surface, whereby the gate trenches 13 are embedded with the metal film 21*a*. The metal film 21*a* is then etched back, so that the metal film 21 is made to remain at the bottom of each gate trench 13, as shown in FIGS. 5A to 5C. The thickness of the metal film 21 is larger in the gate trench 13 formed in the STI region 2 than in the gate trench 13 formed in the active region 10.

Figure 6A:
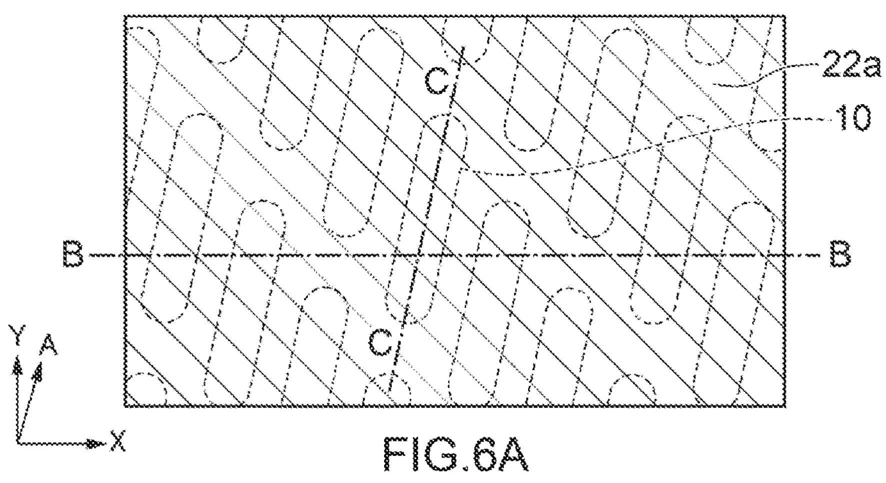
Figure 6B:
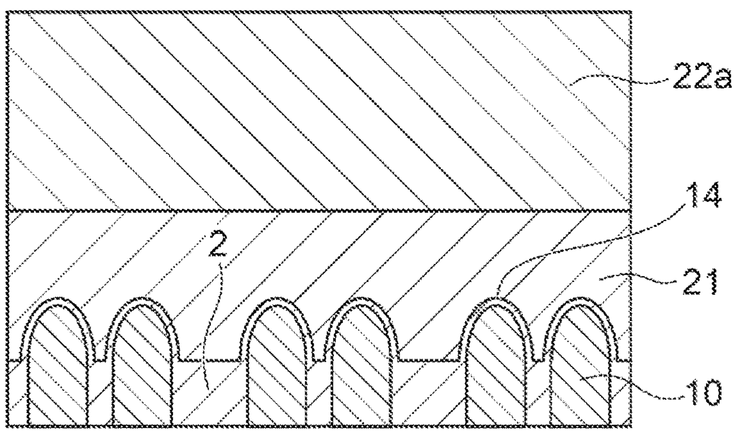
Figure 6C:
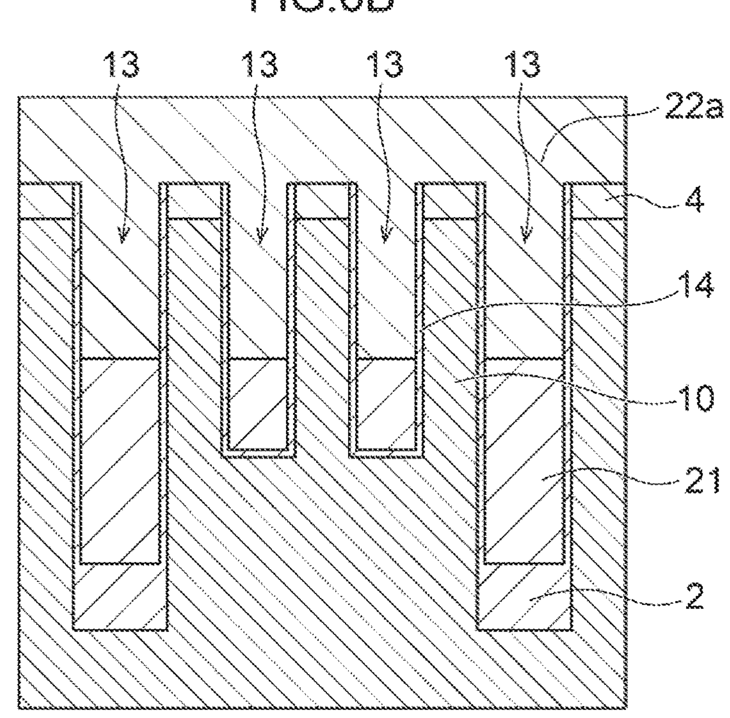
Figures 7A, 7B, 7C:
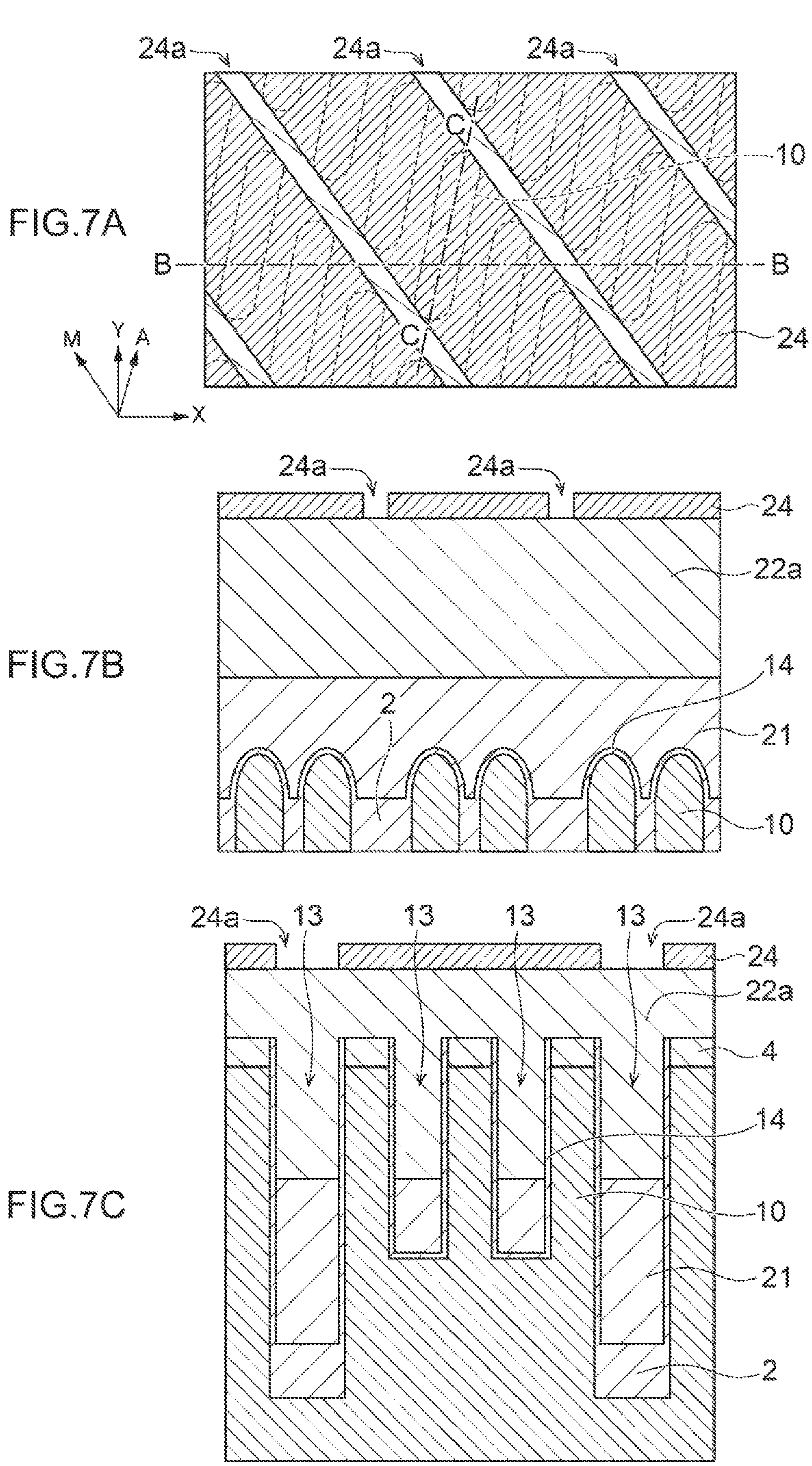
Figures 8A, 8B, 8C:
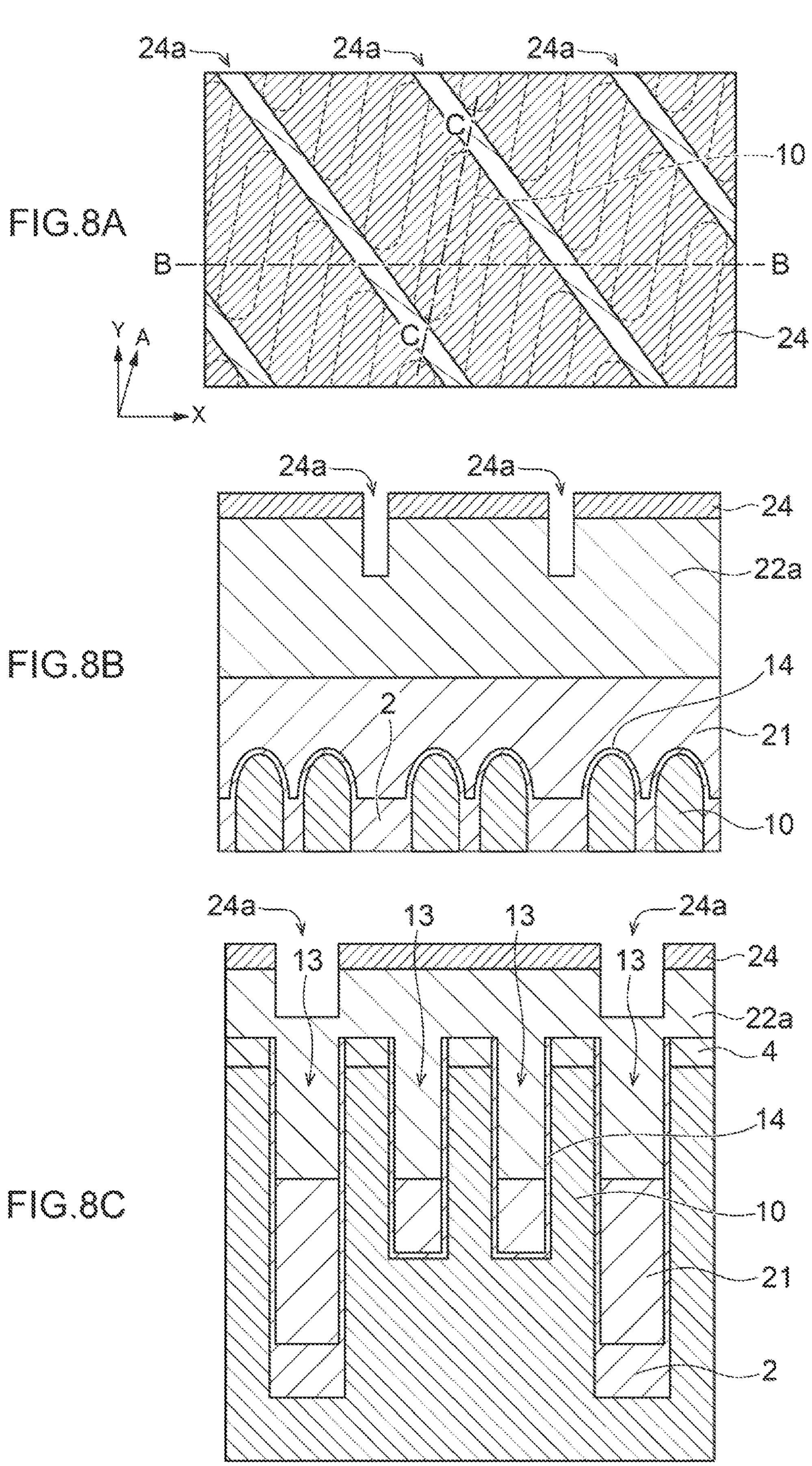

Next, as shown in FIGS. 6A to 6C, a phosphorous-doped polycrystalline silicon film 22*a* is deposited on the entire surface, whereby the gate trenches 13 are embedded with the polycrystalline silicon film 22*a*. A hard mask 24 having openings 24*a* is then formed on the surface of the polycrystalline silicon film 22*a*, as shown in FIGS. 7A to 7C. Each opening 24*a* of the hard mask 24 extends in the M direction so as to overlap the STI region 2 and not to overlap the active region 10. The M direction is the direction in which the active regions 10 are arranged. Accordingly, a portion of the STI region 2 located between the two active regions 10 adjacent to each other in the A direction is not covered with the hard mask 24 but is exposed through the opening 24*a*. The polycrystalline silicon film 22*a* is then etched via the hard mask 24, whereby the thickness of the polycrystalline silicon film 22*a* in the portion overlapped by the opening 24*a* is selectively reduced, as shown in FIGS. 8A to 8C.

Figure 9A:
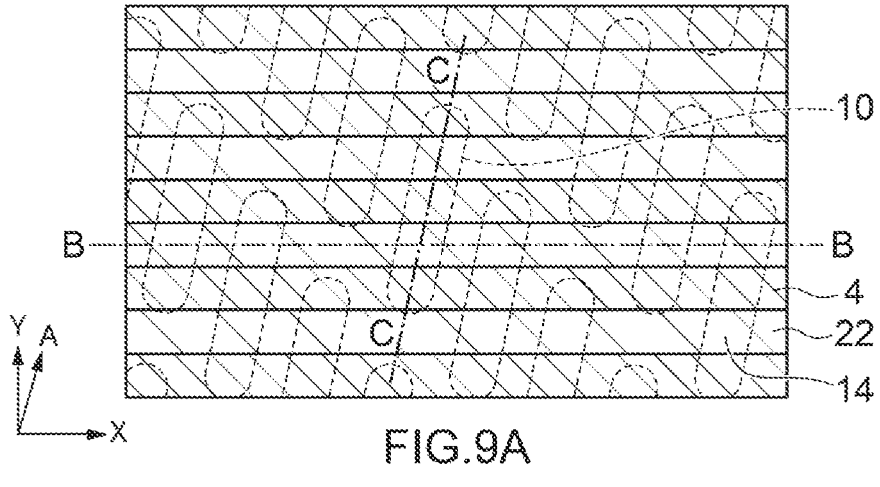
Figure 9B:
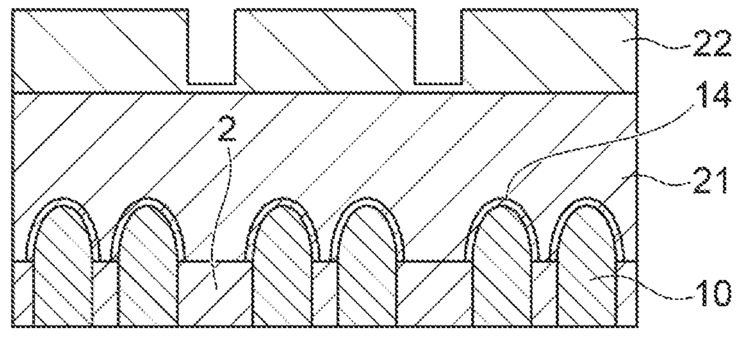
Figure 9C:
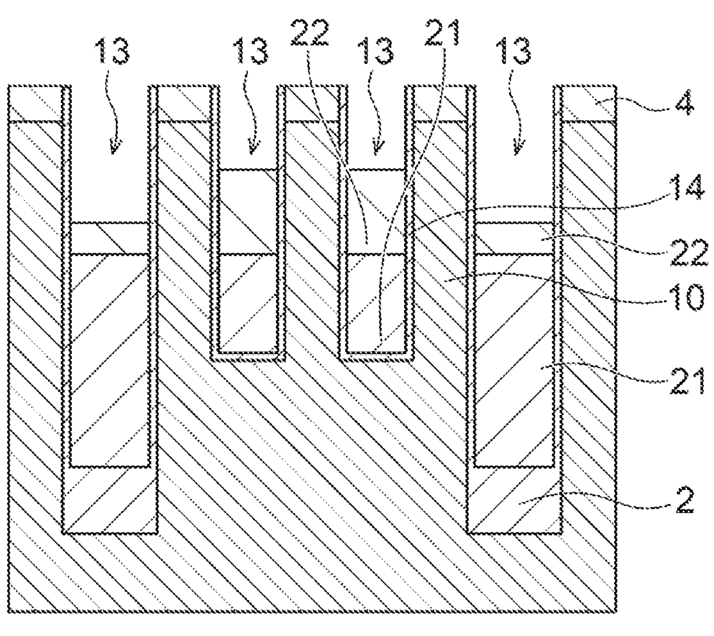
Figure 10A:
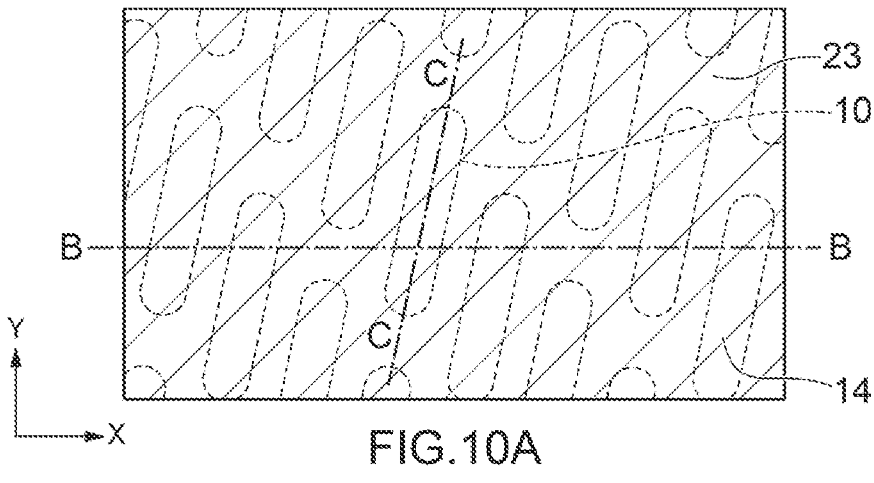
Figure 10B:
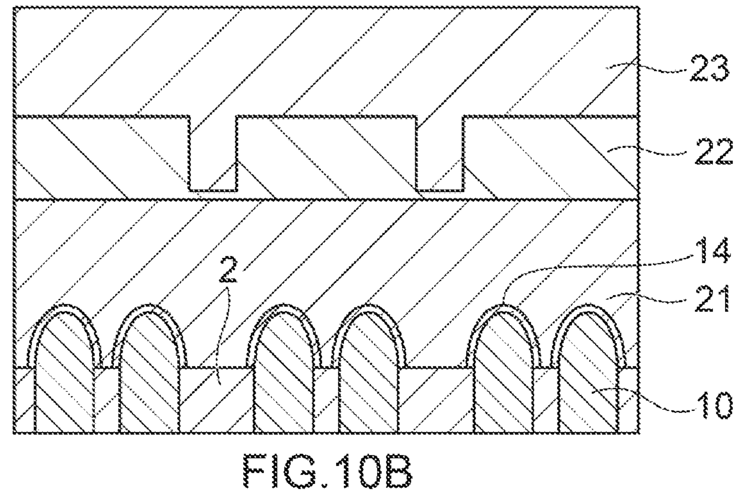
Figure 10C:
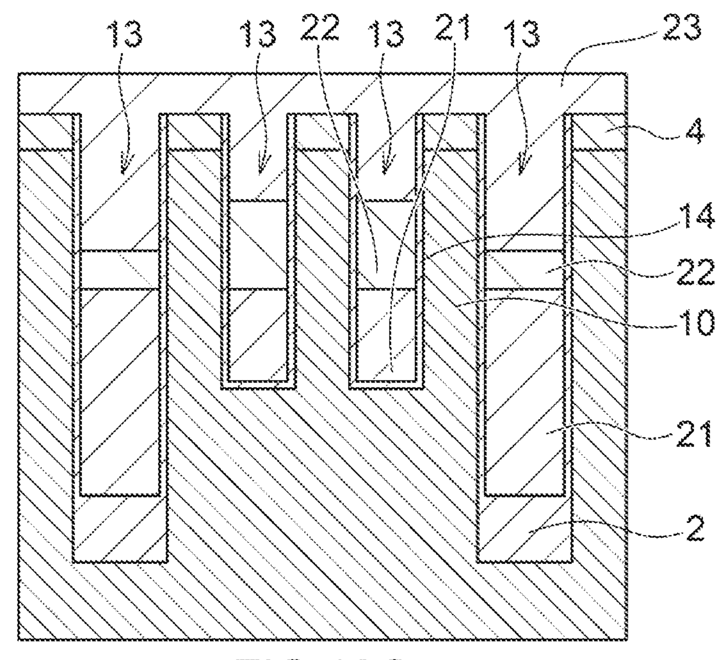

Next, the hard mask 24 is removed, and thereafter the polycrystalline silicon film 22*a* is etched back, whereby the polycrystalline silicon film 22 is made to remain on the metal film 21 in the gate trench 13, as shown in FIGS. 9A to 9C. Consequently, the polycrystalline silicon film 22 in the gate trench 13 formed in the STI region 2 becomes thinner than the polycrystalline silicon film 22 in the gate trench 13 formed in the active region 10. A difference of the thickness of both the polycrystalline silicon films 22 can be adjusted by the amount of the polycrystalline silicon film 22*a* etched via the hard mask 24. Next, as shown in FIGS. 10A to 10C, the gate cap insulating film 23 made of, for example, silicon nitride is deposited on the entire surface, whereby the gate trenches 13 are completely embedded. Thereafter, formation of the bit contact 31 and the cell contact 32, formation of the bit line 41, formation of the cell capacitor 42, and the like are sequentially performed. In this manner, the semiconductor memory device according to the present embodiment is completed.

Figure 11:
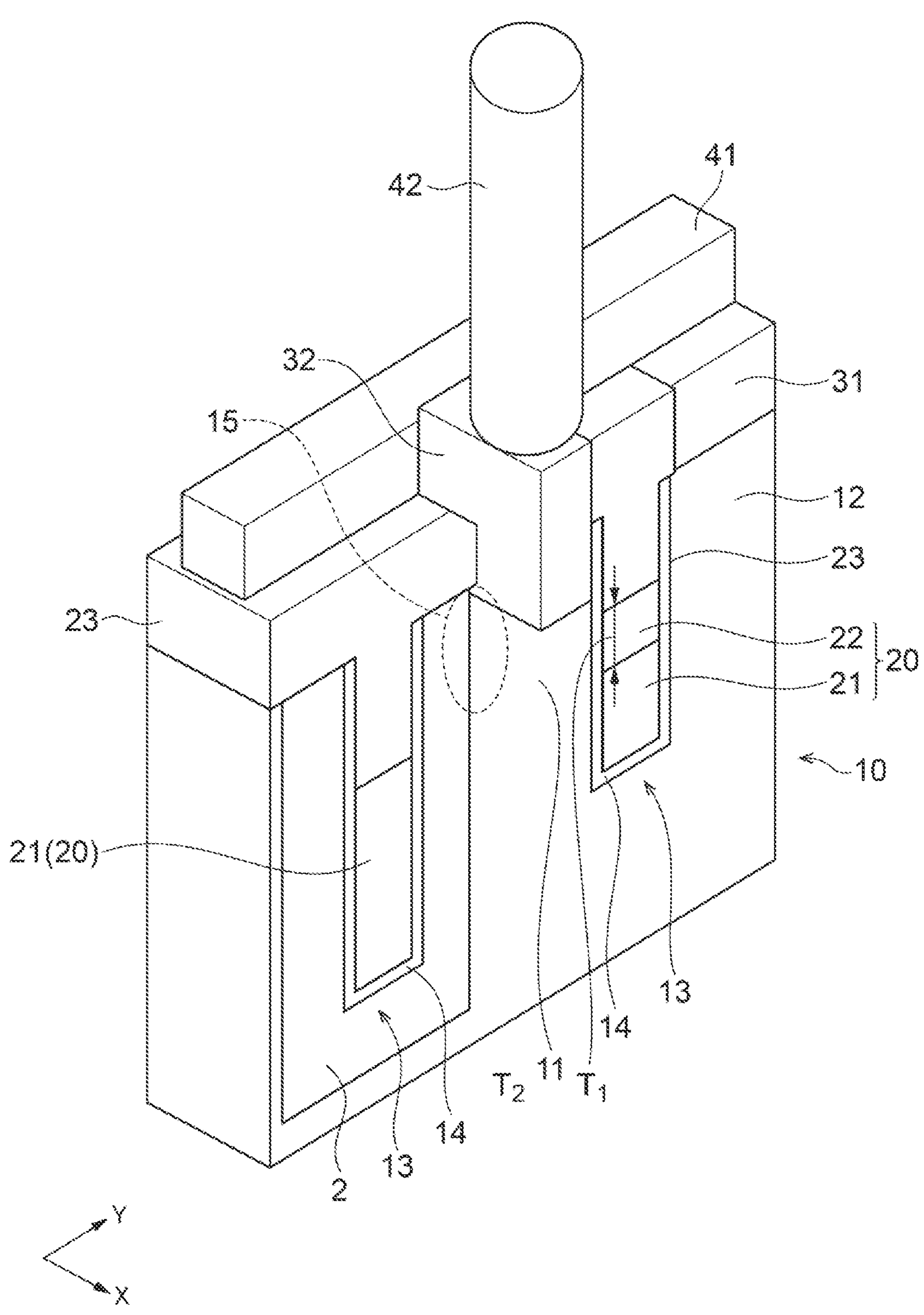
FIG. 11 is a schematic perspective view showing a portion of a semiconductor memory device according to a modification.

FIG. 11 is a schematic perspective view showing a portion of a semiconductor memory device according to a modification. In the example shown in FIG. 11, all of the polycrystalline silicon film 22 is removed in the gate trench 13 formed in the STI region 2. That is, in the gate trench 13 formed in the STI region 2, the metal film 21 and the gate cap insulating film 23 are in direct contact with each other. Also in this configuration, GIDL can be reduced. In order to obtain this configuration, it suffices that the amount of etching is set to be equal to or larger than the thickness T1 in etching of the polycrystalline silicon film 22*a* shown in FIGS. 8A to 8C.

Although various embodiments have been disclosed in the context of certain preferred embodiments and examples, it will be understood by those skilled in the art that the scope of the present disclosure extends beyond the specifically disclosed embodiments to other alternative embodiments and/or uses of the embodiments and obvious modifications and equivalents thereof. In addition, other modifications which are within the scope of this disclosure will be readily apparent to those of skill in the art based on this disclosure. It is also contemplated that various combination or sub-combination of the specific features and aspects of the embodiments may be made and still fall within the scope of the disclosure. It should be understood that various features and aspects of the disclosed embodiments can be combined with or substituted for one another in order to form varying modes of the disclosed embodiments. Thus, it is intended that the scope of at least some of the present disclosure should not be limited by the particular disclosed embodiments described above.

The invention claimed is:

1. An apparatus comprising:

a semiconductor substrate having first and second gate trenches arranged in parallel and extending in a first direction; and first and second gate electrodes embedded in the first and second gate trenches, respectively, via a gate insulating film, wherein each of the first and second gate electrodes includes a first conductive film located at a bottom of the respective first and second gate trenches and a second conductive film stacked on the first conductive film, wherein the second conductive film included in a first portion of the second gate electrode is thinner than the second conductive film included in a first portion of the first gate electrode which is arranged adjacent to the first portion of the second gate electrode in a second direction crossing the first direction, wherein the second conductive film is lower in work function than the first conductive film, and wherein a depth position of an interface between the first conductive film and the second conductive film is the same in the first gate electrode and in the second gate electrode.

2. The apparatus of claim 1, wherein the first portion of the first gate electrode is sandwiched in an active region of the semiconductor substrate in the second direction, and wherein the first portion of the second gate electrode is sandwiched in an STI region in the second direction.

3. The apparatus of claim 1, wherein a first portion of the second gate trench embedding the first portion of the second gate electrode is deeper than a first portion of the first gate trench embedding the first portion of the first gate electrode.

4. The apparatus of claim 3, wherein the first conductive film included in the first portion of the second gate electrode is thicker than the first conductive film included in the first portion of the first gate electrode.

5. The apparatus of claim 4, wherein the first conductive film comprises metal material.

6. The apparatus of claim 5, wherein the first conductive film comprises titanium nitride.

7. The apparatus of claim 5, wherein the second conductive film comprises polycrystalline silicon.

8. The apparatus of claim 3, wherein the semiconductor substrate further has a third gate trench, a first source/drain region located between the first portion of the first gate trench and the first portion of the second gate trench, and a second source/drain region located between the first portion of the first gate trench and a first portion of the third gate trench which is arranged adjacent to the first portion of the first gate electrode in the second direction, wherein the apparatus further comprises:

a third gate electrode embedded in the third gate trench via the gate insulating film;

a first cell capacitor coupled to the first source/drain region; and a bit line coupled to the second source/drain region.

9. The apparatus of claim 8, wherein the third gate electrode includes the first conductive film located at a bottom of the third gate trench and the second conductive film stacked on the first conductive film, and wherein the second conductive film included in the first portion of the second gate electrode is thinner than the second conductive film included in the first portion of the third gate electrode.

10. The apparatus of claim 9, wherein the semiconductor substrate further has a fourth gate trench and a third source/drain region located between the first portion of the third gate trench and a first portion of the fourth gate trench which is arranged adjacently to the first portion of the third gate electrode in the second direction, wherein the apparatus further comprises:

a fourth gate electrode embedded in the fourth gate trench via the gate insulating film; and a second cell capacitor coupled to the third source/drain region, wherein the fourth gate electrode includes the first conductive film located at a bottom of the fourth gate trench and the second conductive film stacked on the first conductive film, and wherein the second conductive film included in the first portion of the fourth gate electrode is thinner than the second conductive film included in the first portion of the third gate electrode.

11. A semiconductor substrate having first and second gate trenches arranged in parallel and extending in a first direction; and first and second gate electrodes embedded in the first and second gate trenches, respectively, via a gate insulating film, wherein each of the first and second gate electrodes includes a first conductive film located at a bottom of the respective first and second gate trenches and a second conductive film stacked on the first conductive film, wherein the second conductive film included in a first portion of the second gate electrode is thinner than the second conductive film included in a first portion of the first gate electrode which is arranged adjacent to the first portion of the second gate electrode in a second direction crossing the first direction, wherein the second conductive film is lower in work function than the first conductive film, wherein each of the first and second gate electrodes includes a cap insulating film stacked on the second conductive film, and wherein a depth position of an interface between the second conductive film and the cap insulating film is deeper in the second gate electrode than in the first gate electrode.

* * * * *